United States Patent
Lim

(10) Patent No.: US 10,261,692 B1
(45) Date of Patent: Apr. 16, 2019

(54) NON-VOLATILE MEMORY AND ERASE CONTROLLING METHOD THEREOF

(71) Applicant: Winbond Electronics Corp., Taichung (TW)

(72) Inventor: Seow Fong Lim, San Jose, CA (US)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 15/847,943

(22) Filed: Dec. 20, 2017

(51) Int. Cl.
  *G11C 16/00* (2006.01)
  *G06F 3/06* (2006.01)
  *H03M 13/05* (2006.01)

(52) U.S. Cl.
  CPC .......... *G06F 3/0608* (2013.01); *G06F 3/0652* (2013.01); *G06F 3/0659* (2013.01); *G06F 3/0673* (2013.01); *H03M 13/05* (2013.01)

(58) Field of Classification Search
  CPC .... G06F 3/0608; G06F 3/0652; G06F 3/0659; G06F 3/0673; H03M 13/05
  USPC ................................................... 365/185.25
  See application file for complete search history.

(56) References Cited

U.S. PATENT DOCUMENTS

| | | | | |
|---|---|---|---|---|
| 5,673,224 A | * | 9/1997 | Chevallier | G11C 16/10 257/E27.103 |
| 5,963,473 A | * | 10/1999 | Norman | G06F 11/1068 365/185.02 |
| 6,028,794 A | * | 2/2000 | Nakai | G11C 16/16 365/185.11 |
| 7,791,954 B2 | | 9/2010 | Parker | |
| 8,432,745 B2 | * | 4/2013 | Wu | G11C 16/0475 365/185.16 |
| 2004/0177212 A1 | * | 9/2004 | Chang | G06F 12/0246 711/103 |
| 2014/0241071 A1 | * | 8/2014 | Goss | G11C 7/20 365/189.05 |
| 2017/0329542 A1 | * | 11/2017 | Chou | G06F 3/0619 |

FOREIGN PATENT DOCUMENTS

| | | |
|---|---|---|
| CN | 1945743 | 4/2007 |
| TW | I330368 | 9/2010 |

* cited by examiner

*Primary Examiner* — Xiaochun L Chen
(74) *Attorney, Agent, or Firm* — JCIPRNET

(57) ABSTRACT

An erase controlling method includes: disposing a plurality of sectors in a memory block of the non-volatile memory; disposing a plurality of auxiliary sectors that respectively correspond to the sectors, wherein each of the sectors shares same word lines with the corresponding auxiliary sector; respectively storing a plurality of erase counting values of the sectors to the auxiliary sectors; generating a total amount of the erase counting values; and, determining whether to perform a refresh operation on the memory block according to the total amount.

16 Claims, 7 Drawing Sheets

| 510 | Erase counting value | ECC1 |
| 520 | Erase counting value | ECC2 |

⋮

| 5M0 | Erase counting value | ECCM |

FIG. 5

NON-VOLATILE MEMORY AND ERASE CONTROLLING METHOD THEREOF

BACKGROUND

Field of the Invention

The invention relates to a non-volatile memory, and more particularly, the invention relates to an erase controlling method for the non-volatile memory.

Description of Related Art

Referring to FIG. 1, which is a schematic diagram of a conventional non-volatile memory. The non-volatile memory 100 includes a memory block 110, and the memory block 110 has a plurality of sectors 111-11N. Furthermore, the non-volatile memory 100 also includes a plurality of erase cycle counters 121-12N. The erase cycle counters 121-12N respectively correspond to the sectors 111-11N, and each of the erase cycle counters 121-12N counts an erase counting value of the corresponding sector. The erase counting value is used to prevent the corresponding sector from wearing out. In conventional art, the erase cycle counters 121-12N are disposed externally from the memory block 110 and have control signals independent from the memory block 110. That is, an increase in the circuit size is needed for disposing the erase cycle counters 121-12N.

On the other hand, in the conventional art, a refresh operation is needed after one of the sectors has been erased. It always costs a significant amount of time to operate the refresh operations frequently, and the efficiency of the non-volatile memory 100 is reduced.

SUMMARY OF THE INVENTION

The disclosure is directed to a non-volatile memory and an erase controlling method thereof, which can reduce a circuit size and an erase time required.

The disclosure provides the erase controlling method including: disposing a plurality of sectors in a memory block of the non-volatile memory; disposing a plurality of auxiliary sectors respectively correspond to the sectors, wherein each of the sectors share same word lines with corresponding auxiliary sector; respectively storing a plurality of erase counting values of the sectors to the auxiliary sectors; generating a total amount of the erase counting values; and, determining whether to perform a refresh operation on the memory block or not according to the total amount.

The disclosure further provides the non-volatile memory including a memory block and a memory controller. The memory block includes a plurality of sectors and a plurality of auxiliary sectors. The auxiliary sectors respectively correspond to the sectors, each of the auxiliary sectors shares same word lines with corresponding sector, and the auxiliary sectors respectively store a plurality of erase counting values of the sectors. The memory controller is configured to: read the erase counting values from the auxiliary sectors, and generate a total amount of the erase counting values; and determine whether to perform a refresh operation on the memory block or not according to the total amount.

According to the above descriptions, the auxiliary sectors for recording the erase counting values of the sectors share same word lines with the sectors, and the circuit size can be reduced. Furthermore, the memory controller determines whether to perform a refresh operation on the memory block or not according to a total amount of the erase counting values. Such that, the sector erase time can be reduced.

In order to facilitate comprehension in the aforementioned and other features and advantages of the invention, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5 is a schematic diagram showing a format of the erase counting value according to an embodiment of the present disclosure.

DETAILED DESCRIPTION OF DISCLOSED EMBODIMENTS

Figure 1:
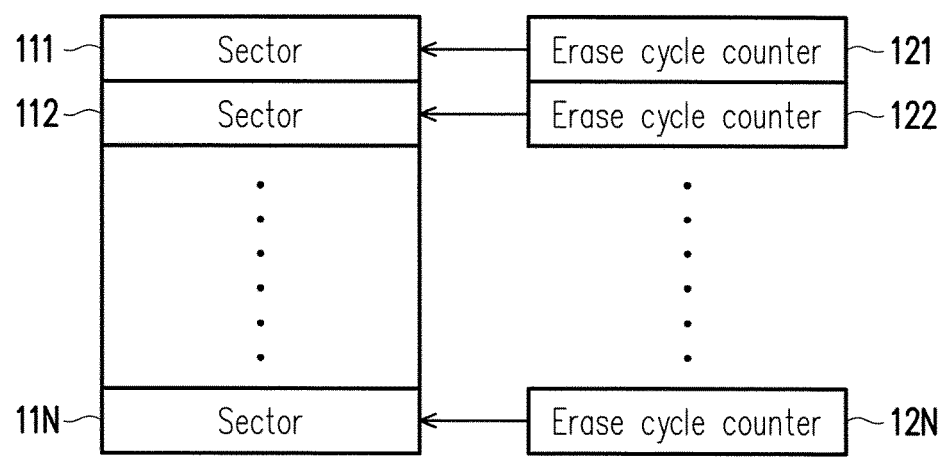
FIG. 1 is a schematic diagram of a conventional non-volatile memory
Figure 2:
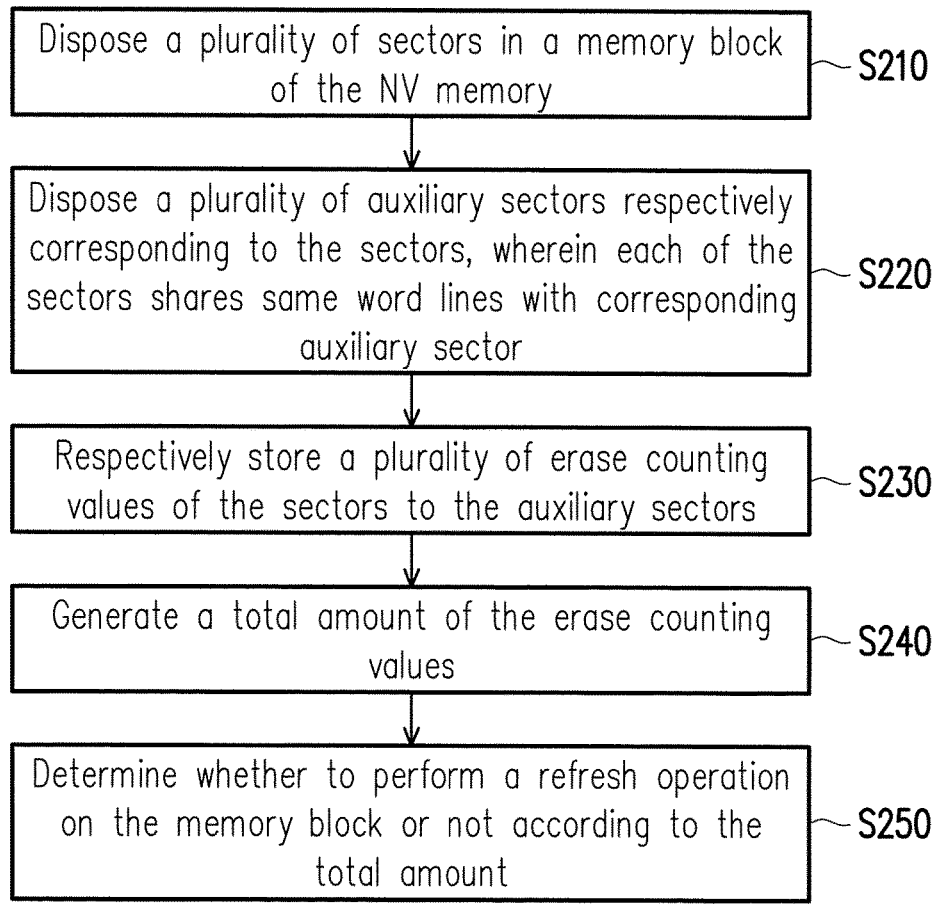
FIG. 2 is a flow chart of an erase controlling method according to an embodiment of the present disclosure.

Referring to FIG. 2, which is a flow chart of an erase controlling method according to an embodiment of the present disclosure. In FIG. 2, a step S210 is used to dispose a plurality of sectors in a memory block of a non-volatile (NV) memory. Further, a step S220 is used to dispose a plurality of auxiliary sectors respectively corresponding to the sectors, wherein each of the sectors shares same word lines with corresponding auxiliary sector.

Figure 3:
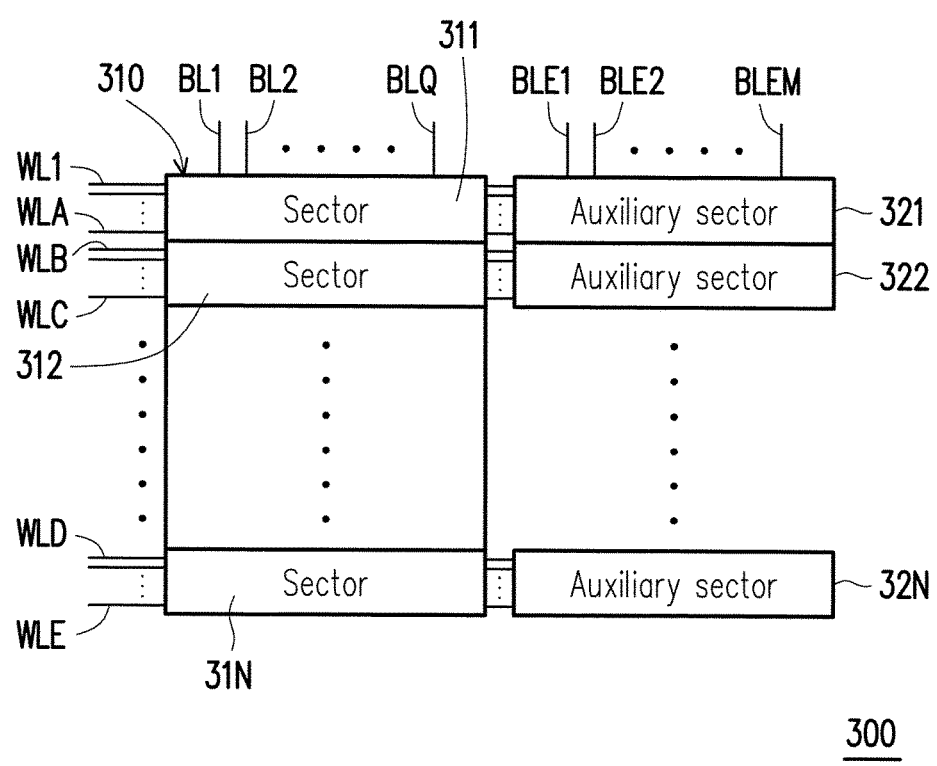
FIG. 3 is a schematic diagram of the NV memory according to an embodiment of the present disclosure.

Referring to FIG. 2 and FIG. 3, where FIG. 3 is a schematic diagram of the NV memory according to an embodiment of the present disclosure. In FIG. 3, the NV memory 300 includes a memory block 310 which includes a plurality of sectors 311-31N. A plurality of word lines WL1-WLE are respectively coupled to the sectors 311-31N, and the sectors 311-31N share bit lines BL1-BLQ. The NV memory 300 also includes a plurality of auxiliary sectors 321-32N, and the auxiliary sectors 321-32N respectively correspond to the sectors 311-31N. In particular, each of the auxiliary sectors 321-32N shares same word lines with corresponding sectors 311-31N. The auxiliary sectors 321-32N are used to store a plurality of erase counting values of the sectors 311-31N, respectively.

For example, in FIG. 3, the word lines WL1-WLA are coupled to the sector 311 and the auxiliary sector 321, so that the sector 311 and the auxiliary sector 321 can receive same word line signals through the word lines WL1-WLA. The word lines WLB-WLC are coupled to the sector 312 and the auxiliary sector 322, and the sector 312 and the auxiliary sector 322 can receive same word line signals through the word lines WLB-WLC. Moreover, the word lines WLD-WLE are coupled to the sector 31N and the auxiliary sectors 32N, so that the sector 31N and the auxiliary sectors 32N can receive same word line signals through the word lines WLD-WLE.

Additionally, the auxiliary sectors 321-32N share bit lines BLE1-BLEM which are different from the bit lines BL1-BLQ. Take the auxiliary sector 321 as an example. The auxiliary sector 321 can be accessed by word line signals on the word lines WL1-WLA. Data can be written (programmed) to the auxiliary sector 321 through the bit lines BLE1-BLEM by enabling the word line signals on the word lines WL1-WLA, and data can be read out from the auxiliary sector 321 through the bit lines BLE1-BLEM by enabling the word line signals on the word lines WL1-WLA.

It can be seen here, that the auxiliary sectors 321-32N share same word lines with corresponding sectors 311-31N, and a circuit size of the NV memory 300 can be reduced.

A step S230 is used to respectively store the erase counting values of the sectors 311-31N to the auxiliary sectors 321-32N, where each of the erase counting values is the number of erase cycles of the corresponding sector 311-31N, and a step S240 is used to generate a total amount of the erase counting values. Then, a step S250 can be executed to determine whether to perform a refresh operation on the memory block 310 or not according to the total amount.

It can be seen, in the present embodiment, that the refresh operation on the memory block 310 need not be performed after each erase operation has been operated. Here, a threshold value can be pre-set, and the refresh operation is only performed if the total amount is larger than the threshold value. On the contrary, if the total amount is not larger than the threshold value, the refresh operation on the memory block can be skipped.

The detailed operation of the step S240 is as follows. An erase command can be received by the NV memory 300 of the present embodiment, where the erase command may be a sector erase command or a block erase command. Then, the erase counting values can be obtained by reading the auxiliary sectors 321-32N in sequence according to the erase command. Then, the total amount can be generated by summing all of the erase counting values read from the auxiliary sectors 321-32N.

Furthermore, if the erase command is the sector erase command, whether an accessed sector (one of the sectors 311-31N) is a sector to be erased can be determined. If the accessed sector is a sector to be erased, the erase counting value corresponding to the accessed sector can be recoded, and a temporary value can be obtained accordingly. Then, an erasing operation can be performed on the sector to be erased, the temporary value can be increased by 1, and then, the increased temporary value is written to the auxiliary sector corresponding to the accessed sector to update the erase counting value of the now-erased sector. To operate the erasing operation, a program operation can be performed before the erasing operation, and a soft program operation can be performed after the erasing operation.

On the other hand, if the erase command is the block erase command, the temporary value is decided according to the total amount of the erase counting values. Then, all of the erase counting values in the auxiliary sectors are updated according to the temporary value. Here, the temporary value can be set to equal to the total amount divided by NA, where NA is a positive value not smaller than 1. In one embodiment, NA may equal 1, and in another embodiment, NA may equal the number of sectors 311-31N.

Figure 4A:
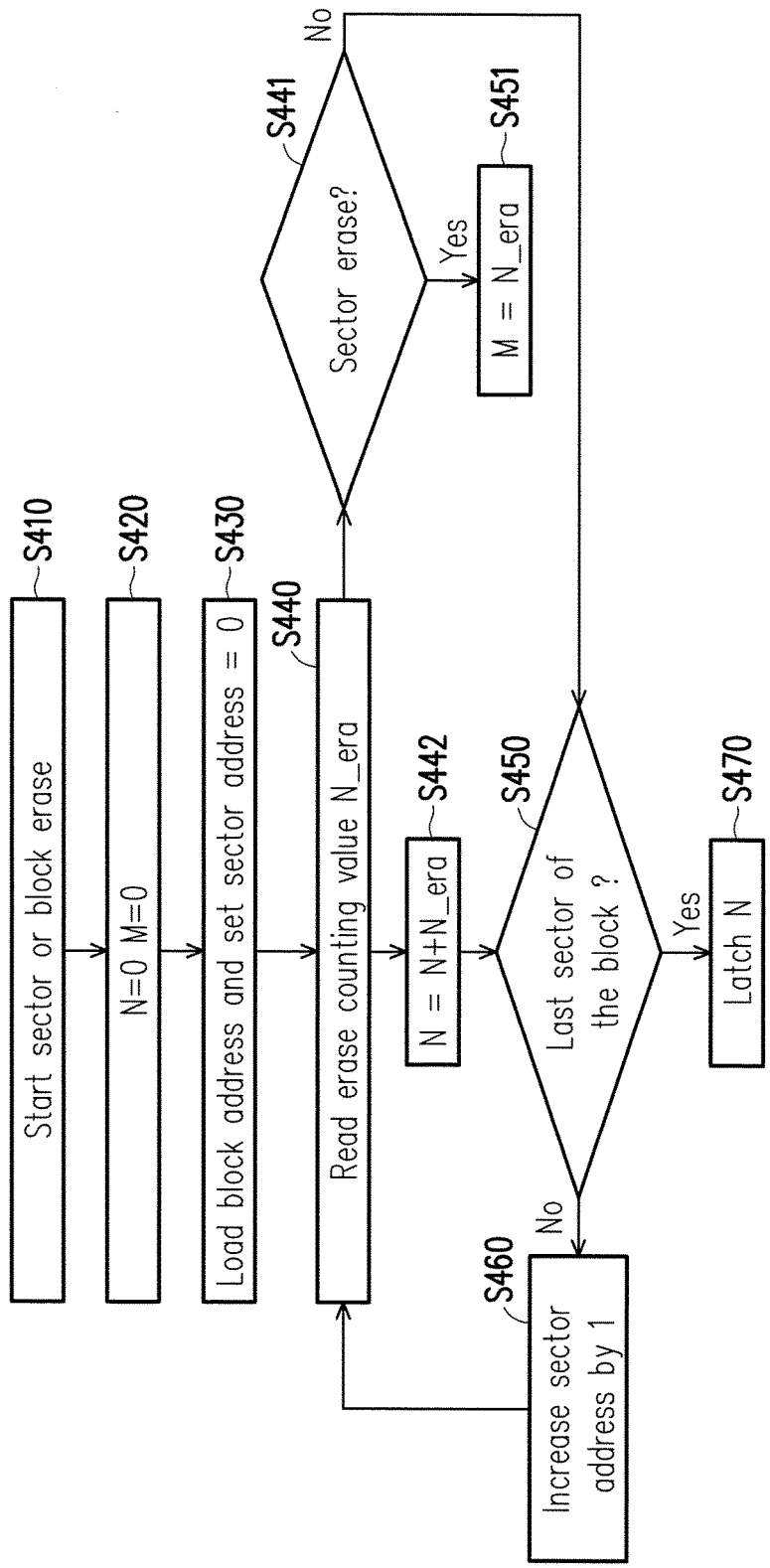
FIG. 4A and FIG. 4B are a flow chart of an erase controlling method according to another embodiment of the present disclosure.
Figure 4B:
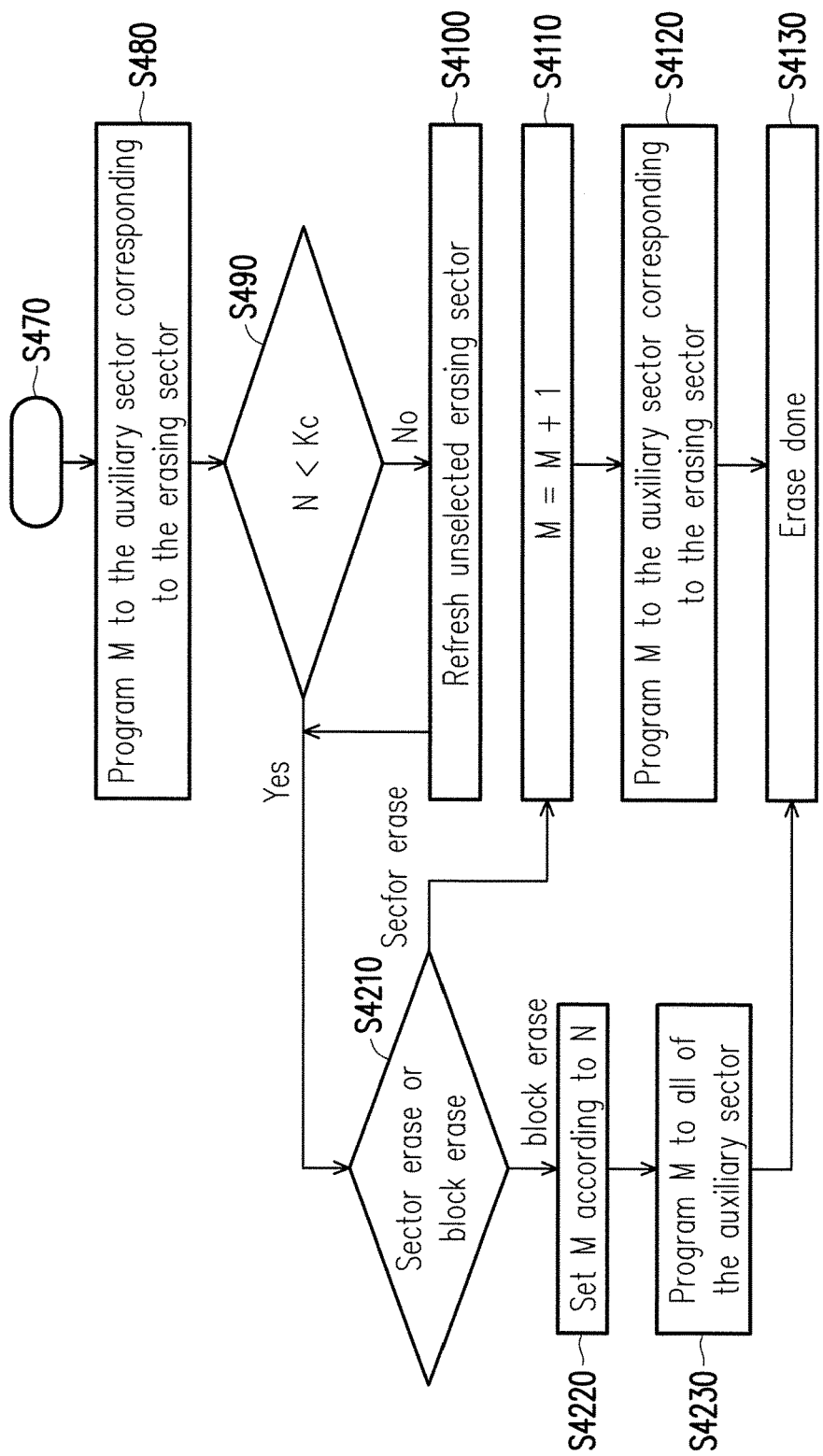

Referring to FIG. 4A and FIG. 4B, which is a flow chart of an erase controlling method according to another embodiment of the present disclosure. In FIG. 4A, a step S410 for starting a sector or block erase operation is executed. A total amount N and a temporary value M is reset to 0 in a step S420. In a step S430, a block address for erasing is loaded and a sector address is set to 0. Then, an erase counting value N_era is read from an auxiliary sector based on the sector address in a step S440. Then, a step S441 is used to determine whether the erase operation is the sector erase operation, if the erase operation is the sector erase operation, the temporary value M is set equal to the erase counting value N_era in a step S451, and if the erase operation is not the sector erase operation, a step S450 can be executed.

After the step S440, the erase counting value N_era can be accumulated to obtain the total amount N by setting N=N+N_era in a step S442. Then, whether a currently accessed sector is a last sector or not can be determined in a step S450. If the currently accessed sector is not the last sector, the sector address can be increased by 1 in a step S460, and the step S440 can be executed again. On the contrary, if the currently accessed sector is the last sector, the total amount N can be latched in a step S470.

Referring to FIG. 4B, continuing on from the step S470, a program operation, an erase operation and soft program operation are operated in sequence in a step S480. After the erase operation has finished, whether the total amount N is smaller than a threshold value Kc is determined in a step S490. If the total amount N is smaller than the threshold value Kc, a step S4100 can be executed, and if the total amount N is not smaller than the threshold value Kc, a step S4210 can be executed.

In the step S4100, a refresh operation can be operated on the sectors which are not selected for the erase operation, and then the step S4210 for judging whether the erase command is a sector erase or a block erase command can be executed.

If the erase command is the sector erase command, the temporary value M is increased by 1 in a step S4110, and then, in a step S4120, the updated temporary value M can be programmed to the auxiliary sector corresponding to the accessed sector. After which, the erase command has been completed (step S4130).

On the other hand, if the erase command is the block erase command, a step S4220 sets the temporary value M according to the total amount N, and then program the temporary value M to all of the auxiliary sectors in a step S4230. After which, the erase command has been completed (step S4130).

Figure 5:
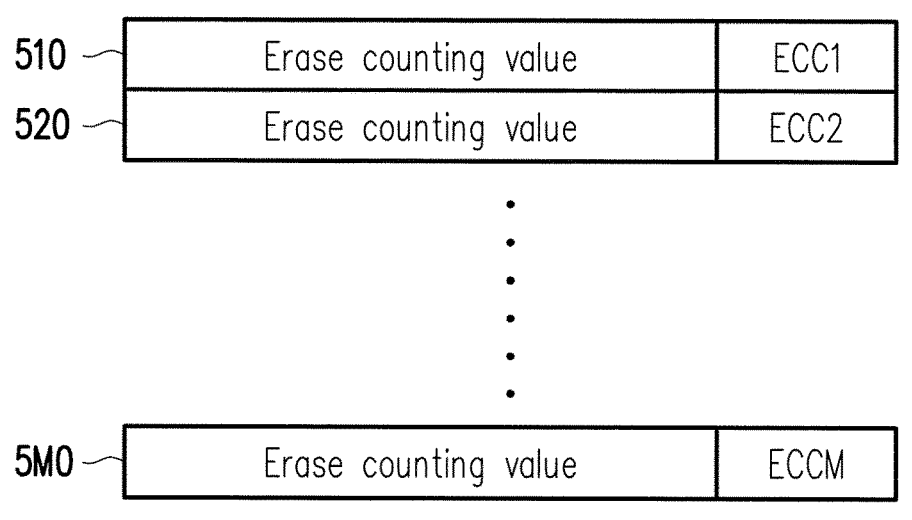

Referring to FIG. 5, which is a schematic diagram showing a format of the erase counting value according to an embodiment of the present disclosure. In FIG. 5, a plurality of error correction codes ECC1-ECCM can be generated respectively according to the erase counting values 510-5M0. Each of the erase counting values 510-5M0 can be programmed into the corresponding auxiliary sector with each of the error correction codes ECC1-ECCM. That is, robustness of the erase counting values 510-5M0 can be increased.

It should be noted here, that the error correction codes ECC1-ECCM can be generated by any encoding method well known by a person skilled in the art.

Figure 6:
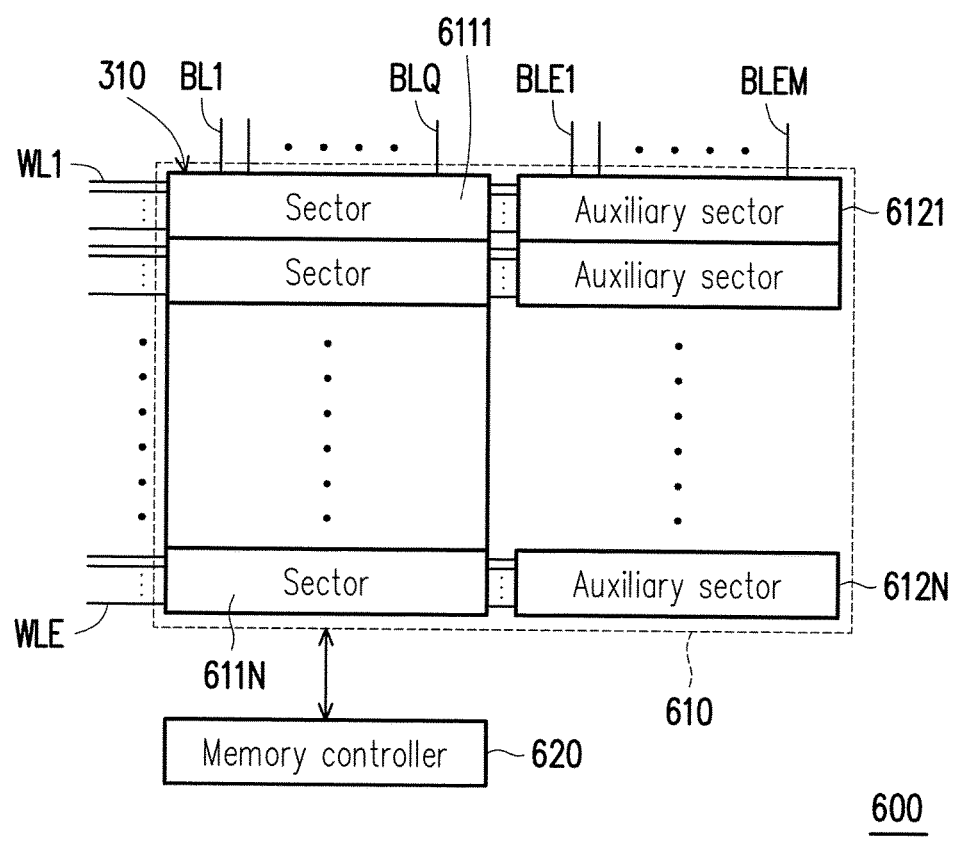
FIG. 6 is a block diagram of a non-volatile (NV) memory according to an embodiment of the present disclosure.

Referring to FIG. 6, which is a block diagram of a non-volatile (NV) memory according to an embodiment of the present disclosure. The NV memory 600 includes a memory block 610 and a memory controller 620. The memory block 610 is coupled to the controller 620, and the memory block 610 includes a plurality of sectors 6111-611N and a plurality of the auxiliary sectors 6121-612N. The sectors 6111-611N are coupled to word lines WL1-WLE and bit lines BL1-BLQ, and the auxiliary sectors 6121-612N are coupled to the word lines WL1-WLE and bit lines BLE1-BLEM. The sectors 6111-611N respectively correspond to the auxiliary sectors 6121-612N, and each of the sectors 6111-611N shares same word lines with corresponding auxiliary sector.

The memory controller 620 is used to execute the steps S230-S250 in FIG. 2, or execute the steps in FIG. 4A and FIG. 4B. In an embodiment, the memory controller 620 further generates the error correction codes of the erase counting values.

The detailed operation for the steps in FIG. 2, FIG. 4A and FIG. 4B have been described in the embodiments mentioned above, and will not be repeated here.

In summary, the present disclosure provides auxiliary sectors corresponding to sectors, and stores erase counting values of the corresponding sectors in the auxiliary sectors. The sectors and the corresponding auxiliary sectors are disposed such that each respectively shares same word lines, and a circuit size of the non-volatile (NV) memory can be reduced. Furthermore, a refresh operation for the memory block is determined by the total amount of the erase counting values of all of the sectors. The time period for the erase operation can be reduced, and the efficiency of the NV memory can be improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An erase controlling method, adapted for a non-volatile memory, comprising:
    disposing a plurality of sectors in a memory block of the non-volatile memory;
    disposing a plurality of auxiliary sectors respectively corresponding to the sectors, wherein each of the sectors shares same word lines with the corresponding auxiliary sector;
    respectively storing a plurality of erase counting values of the sectors to the auxiliary sectors;
    generating a total amount of the erase counting values, wherein generating the total amount of the erase counting values comprises:
        receiving an erase command, where the erase command is a sector erase command or a block erase command;
        reading the erase counting values by accessing the auxiliary sectors in sequence according to the erase command; and
        summing the erase counting values to generate the total amount; and
    determining whether to perform a refresh operation on the memory block according to the total amount.

2. The erase controlling method as claimed in claim 1, further comprising:
    if the erase command is the sector erase command, deciding whether an accessed sector is a sector to be erased; and
    if the accessed sector is the sector to be erased, recoding the erase counting value corresponding to the accessed sector to obtain a temporary value.

3. The erase controlling method as claimed in claim 2, further comprising:
    increasing the temporary value by 1;
    performing an erasing operation on the sector to be erased; and
    writing the increased temporary value to the auxiliary sector corresponding to the accessed sector.

4. The erase controlling method as claimed in claim 3, wherein the step of performing the erasing operation on the sector to be erased comprises:
    performing a program operation, the erasing operation and a soft program operation in sequence on the sector to be erased.

5. The erase controlling method as claimed in claim 1, further comprising:
    if the erase command is the block erase command, deciding a temporary value according to the total amount; and
    updating all of the erase counting values in the auxiliary sectors according to the temporary value.

6. The erase controlling method as claimed in claim 5, wherein a step of deciding the temporary value according to the total amount comprises:
    setting the temporary value equal to the total amount divided by NA, where NA is a positive value not smaller than 1.

7. The erase controlling method as claimed in claim 1, wherein a step of determining whether to perform the refresh operation on the memory block according to the total amount comprises:
    comparing the total amount with a threshold value;
    performing the refresh operation on the memory block if the total amount is larger than the threshold value; and
    skipping the refresh operation on the memory block if the total amount is not larger than the threshold value.

8. The erase controlling method as claimed in claim 1, further comprising:
    generating a plurality of error correction codes respectively according to the erase counting values;
    respectively storing the error correction codes to the corresponding auxiliary sectors.

9. A non-volatile memory, comprising:
    a memory block, comprising:
        a plurality of sectors; and
        a plurality of auxiliary sectors, wherein the auxiliary sectors respectively correspond to the sectors, each of the auxiliary sectors shares same word lines with the corresponding sector, and the auxiliary sectors respectively store a plurality of erase counting values of the sectors; and
    a memory controller, configured to:
        receive an erase command, where the erase command is a sector erase command or a block erase command;
        read the erase counting values by accessing the sectors in sequence according to the erase command;
        generate a total amount by summing the erase counting values; and
        determine whether to perform a refresh operation on the memory block according to the total amount.

10. The non-volatile memory as claimed in claim 9, wherein if the erase command is the sector erase command, the memory controller decides whether an accessed sector is a sector to be erased, and if the accessed sector is the sector to be erased, the memory controller recodes the erase counting value corresponding to the accessed sector to obtain a temporary value.

11. The non-volatile memory as claimed in claim 10, wherein the memory controller further increases the temporary value by 1, performs an erasing operation on the sector to be erased, and writes the increased temporary value to the auxiliary sector corresponding to the accessed sector.

12. The non-volatile memory as claimed in claim 11, wherein the memory controller further performs a program operation, the erasing operation and a soft program operation on the sector to be erased in sequence.

13. The non-volatile memory as claimed in claim 9, wherein if the erase command is the block erase command, the memory controller decides a temporary value according to the total amount, and updates all of the erase counting values in the auxiliary sectors according to the temporary value.

14. The non-volatile memory as claimed in claim 13, wherein the memory controller sets the temporary value equal to the total amount divided by NA, where NA is a positive value not smaller than 1.

15. The non-volatile memory as claimed in claim 9, wherein the memory controller is configured to:
compare the total amount with a threshold value;
perform the refresh operation on the memory block if the total amount is larger than the threshold value; and
skip the refresh operation on the memory block if the total amount is not larger than the threshold value.

16. The non-volatile memory as claimed in claim 9, wherein the memory controller is further configured to:
generate a plurality of error correction codes respectively according to the erase counting values;
respectively store the error correction codes to the corresponding auxiliary sectors.

* * * * *